United States Patent
Hoshina (10) Patent No.: US 10,234,738 B2
(45) Date of Patent: Mar. 19, 2019

(54) LIQUID CRYSTAL DISPLAY DEVICE INCLUDING ALTERNATING COLORS IN COLUMN

(71) Applicant: Japan Display Inc., Minato-ku (JP)

(72) Inventor: Katsuhiro Hoshina, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/708,417

(22) Filed: Sep. 19, 2017

(65) Prior Publication Data

US 2018/0088423 A1  Mar. 29, 2018

(30) Foreign Application Priority Data

Sep. 26, 2016 (JP) .................. 2016-186617

(51) Int. Cl.
| | |
|---|---|
| *G02F 1/1362* | (2006.01) |
| *G02F 1/1368* | (2006.01) |
| *G09G 3/36* | (2006.01) |
| *H01L 27/12* | (2006.01) |
| *G02F 1/1335* | (2006.01) |

(52) U.S. Cl.
CPC ...... *G02F 1/136286* (2013.01); *G02F 1/1368* (2013.01); *G02F 1/133514* (2013.01); *G02F 1/136227* (2013.01); *G09G 3/3607* (2013.01); *H01L 27/124* (2013.01); *G02F 2201/52* (2013.01); *G09G 2300/0452* (2013.01)

(58) Field of Classification Search
CPC ......... G02F 1/136286; G02F 1/136227; G02F 1/1368; H01L 27/124; G09G 3/3607; G09G 2300/0452
See application file for complete search history.

(56) References Cited

U.S. PATENT DOCUMENTS

| | | | | |
|---|---|---|---|---|
| 9,372,359 | B2* | 6/2016 | Nagami | G02F 1/13338 |
| 9,608,050 | B2* | 3/2017 | Jin | H01L 27/3262 |
| 9,709,860 | B2* | 7/2017 | Miyazaki | G02F 1/133345 |
| 9,741,296 | B2* | 8/2017 | Takahashi | G09G 3/3607 |
| 2005/0173707 | A1* | 8/2005 | Shiraki | G02F 1/136259 |
| | | | | 257/72 |
| 2008/0123007 | A1* | 5/2008 | Cui | G02F 1/13394 |
| | | | | 349/43 |
| 2015/0346572 | A1 | 12/2015 | Hirosawa | |
| 2018/0088423 | A1* | 3/2018 | Hoshina | G02F 1/133514 |
| 2018/0182336 | A1* | 6/2018 | Xing | G09G 3/3677 |

FOREIGN PATENT DOCUMENTS

JP        2015-225300        12/2015

* cited by examiner

*Primary Examiner* — John P. Dulka
(74) *Attorney, Agent, or Firm* — Oblon, McClelland, Maier & Neustadt, L.L.P.

(57) ABSTRACT

To provide a liquid crystal display device including a plurality of gate lines extending in a first direction; a plurality of source lines extending in a second direction; and a plurality of pixel areas each surrounded by the gate line and the source line, and arranged in a matrix, wherein each of the pixel areas includes a switching device connected through a contact hole to the source line, each of the plurality of pixel areas is assigned any of at least four colors, two colors out of the four colors are alternately arranged in a same column of the pixel areas, and the switching devices in the respective pixel areas for the two colors alternately arranged share the contact hole connected to the source line.

11 Claims, 7 Drawing Sheets

LIQUID CRYSTAL DISPLAY DEVICE INCLUDING ALTERNATING COLORS IN COLUMN

CROSS-REFERENCE TO RELATED APPLICATION

The present application claims priority from Japanese application JP2016-186617 filed on Sep. 26, 2016, the content of which is hereby incorporated by reference into this application.

BACKGROUND OF THE INVENTION

1. Field of the Invention

The present invention relates to a liquid crystal display device.

2. Description of the Related Art

Conventionally, there has been known a liquid crystal display device that includes pixels for a plurality of colors RGB+α arranged in a matrix in a display area in order to achieve higher luminance and reduced power consumption. Pixels for the plurality of colors include, for example, a red pixel, a green pixel, a blue pixel, and a white pixel. When the areas that contribute to display (an aperture width) of these pixels are equivalent, luminance of blue is insufficient. In view of the above, for example, JP2015-225300 discloses a structure for improving display quality in which a blue pixel has a larger area and a white pixel has a smaller area whereby the blue pixel has an enlarged display-contributing area.

The present applicant has studied for further improvement to achieve higher luminance by enlarging the display-contributing area of a pixel having smaller luminance.

An objection of the present invention is to provide a liquid crystal display device that realizes high luminance and low power consumption.

SUMMARY OF THE INVENTION

According to one aspect of the present invention, there is provided a liquid crystal display device including a plurality of gate lines extending in a first direction; a plurality of source lines extending in a second direction; and a plurality of pixel areas each surrounded by the gate line and the source line, and arranged in a matrix, wherein each of the pixel areas includes a switching device connected through a contact hole to the source line, each of the plurality of pixel areas is assigned any of at least four colors, two colors out of the four colors are alternately arranged in a same column of the pixel areas, and the switching devices in the respective pixel areas for the two colors alternately arranged share the contact hole connected to the source line.

According to another aspect of the present invention, there is provided a liquid crystal display device including a plurality of first gate lines and a plurality of second gate lines extending along a first direction and alternately disposed in a second direction intersecting the first direction; a first source line and a second source line extending along the second direction, and disposed adjacent to each other in the first direction;

a first pixel disposed in an area defined by the first gate line and the second gate line adjacent to each other and the first source line and the second source line adjacent to each other, and having a first switching device having a first semiconductor layer electrically connected to the first gate line and the second source line; a second pixel disposed adjacent to the first pixel in the second direction and having a second switching device having a second semiconductor layer electrically connected to the second gate line and the second source line and having luminance smaller than luminance of the first pixel; a first contact structure disposed on a side of the first pixel via the first gate line and electrically connecting the first semiconductor layer and the first gate line; and a second contact structure disposed on the side of the first pixel via the second gate line and electrically connecting the second semiconductor layer and the second gate line, wherein the first semiconductor layer has a substantially J shape that extends from the first contact structure, bends so as to intersect the first gate line at two positions, and further extends to the side of the first pixel along the second source line, and the second semiconductor layer has a substantially J shape that extends from the second contact structure, bends so as to intersect the second gate line at two positions, and further extends to the side of the first pixel along the second source line.

DETAILED DESCRIPTION OF THE INVENTION

The following describes an embodiment of the present invention (hereinafter referred to as this embodiment), with reference to the drawings.

In this embodiment, in description of an aspect in which a component is disposed "on" another component, a simple description of being "on" refers not only to a case in which a component is disposed directly, that is, in contact with, the other component, but also to a case in which a component is disposed above the other component with a still another component intervening, unless otherwise stated.

Figure 1:
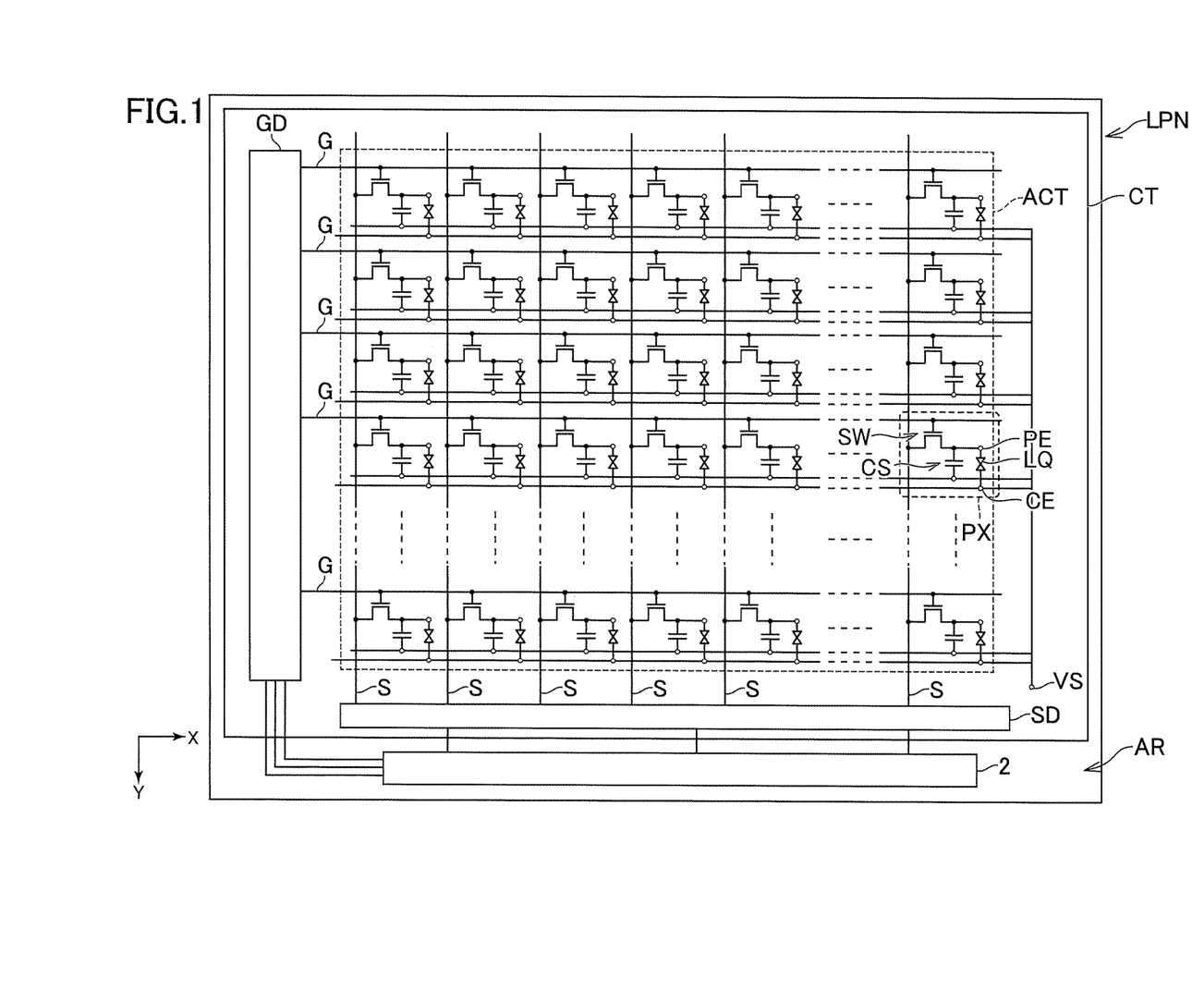
FIG. 1 schematically illustrates a structure of a liquid crystal display panel LPN and an equivalent circuit that constitutes a liquid crystal display device according to this embodiment.

FIG. 1 schematically illustrates a structure of a liquid crystal display panel LPN and an equivalent circuit that constitutes a liquid crystal display device according to this embodiment. In the respective figures, a number is imparted to a reference mark PX that identifies a pixel in order to discriminate a pixel. The number, however, is omitted in the description below when discrimination is unnecessary. This is applied also to a gate line G, a source line S, a color filter CF, a pixel electrode PE, and so forth.

A liquid crystal display device has a liquid crystal display panel LPN of an active matrix type. The liquid crystal display panel LPN includes an array substrate AR, an opposite substrate CT opposed to the array substrate AR, and a liquid crystal layer LQ held between the array substrate AR and the opposite substrate CT. The liquid crystal display panel LPN has an active area ACT (a display area) for displaying an image. The active area ACT corresponds to an area where the liquid crystal layer LQ is held between the array substrate AR and the opposite substrate CT. The active area ACT is, for example, quadrilateral, and includes a plurality of pixels PX arranged in a matrix.

The array substrate AR has a plurality of gate lines G, source line S, switching devices SW, pixel electrodes PE, common electrodes CE, and stored capacitors CS in the active area ACT. The plurality of gate lines G extend substantially in a first direction X, and are aligned in a second direction Y that intersects the first direction X. A gate signal for indicating timing to apply a video signal to each pixel area flows in the gate line G. Meanwhile, the plurality of source lines S extend substantially in the second direction Y, and are aligned in the first direction X. A video signal to be applied to each pixel flows in the source line S. The gate line G and the source line S may be laid out so as to bend in agreement with the layout or shape of a pixel, as is to be described later. The switching device SW is electrically connected to the gate line G and the source line S in each pixel PX. The pixel electrode PE is electrically connected to the switching device SW in each pixel PX. The common electrode CE is formed common to a plurality of pixels PX and opposed to the respective pixel electrodes PE in the active area ACT. The common electrode CE is disposed for each pixel PX, and extends in the second direction Y over the gate lines G, and also in the first direction X over the source lines S. The stored capacitor CS is formed, for example, between the common electrode CE and the pixel electrode PE.

Each gate line G is led to outside the active area ACT to be connected to a first drive circuit GD. Each source line S is led to outside the active area ACT to be connected to a second drive circuit SD. The first drive circuit GD and the second drive circuit SD are formed at least partially on the array substrate AR, and connected to a drive IC chip 2. The drive IC chip 2 includes a controller for controlling the first drive circuit GD and the second drive circuit SD, and functions as a signal source for supplying a signal necessary to drive the liquid crystal display panel LPN. In the illustrated example, the drive IC chip 2 is mounted on the array substrate AR outside the active area ACT. The common electrode CE is led to outside the active area ACT to be connected to a power supply unit VS. The power supply unit VS supplies common potential to the common electrode CE.

Figure 2:
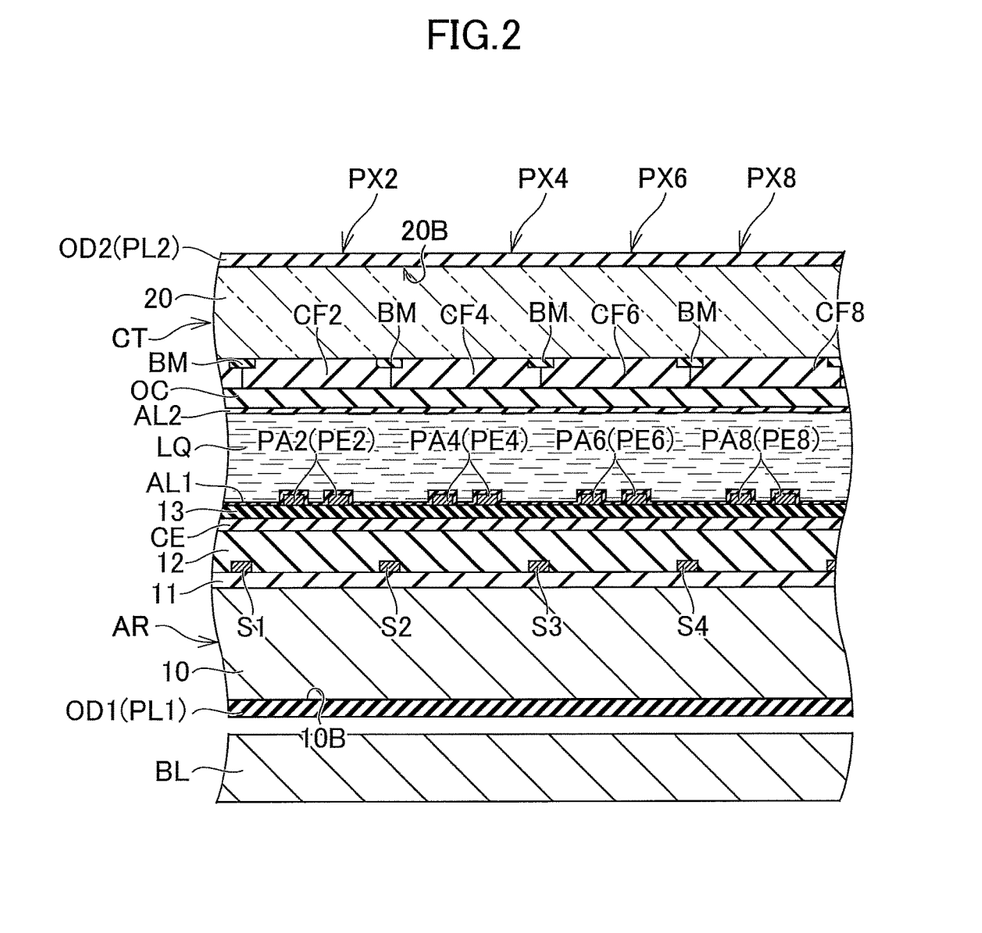
FIG. 2 is a schematic cross sectional view of a structure of a liquid crystal display panel including pixels.

FIG. 2 is a schematic cross sectional view of a structure of a liquid crystal display panel including pixels, illustrating a cross section along the line II-II in FIG. 4 to be described later.

The array substrate AR includes a transparent first insulating substrate 10, such as a glass substrate or a resin substrate. The array substrate AR has a source line S, a common electrode CE, a pixel electrode PE, a first insulating film 11, a second insulating film 12, a third insulating film 13, a first alignment layer AL1, or the like, on a side thereof opposed to the opposite substrate CT of the first insulating substrate 10.

The source line S (S1 to S4) is formed on the first insulating film 11 and covered by the second insulating film 12. The gate line G (not shown in FIG. 2) is formed between the first insulating substrate 10 and the first insulating film 11. The first insulating film 11 is usually made using an inorganic insulating film made of, for example, silicon nitride (SiN) or silicon oxide (SiO), while the second insulating film 12 is usually made using an organic insulating film. The common electrode CE is formed on the second insulating film 12, and covered by the third insulating film 13. The common electrode CE is made of transparent conductive material, for example, indium-tin-oxide (ITO) or indium-zinc-oxide (IZO), and formed over a plurality of pixels PX in the entire active area ACT.

Figure 4:
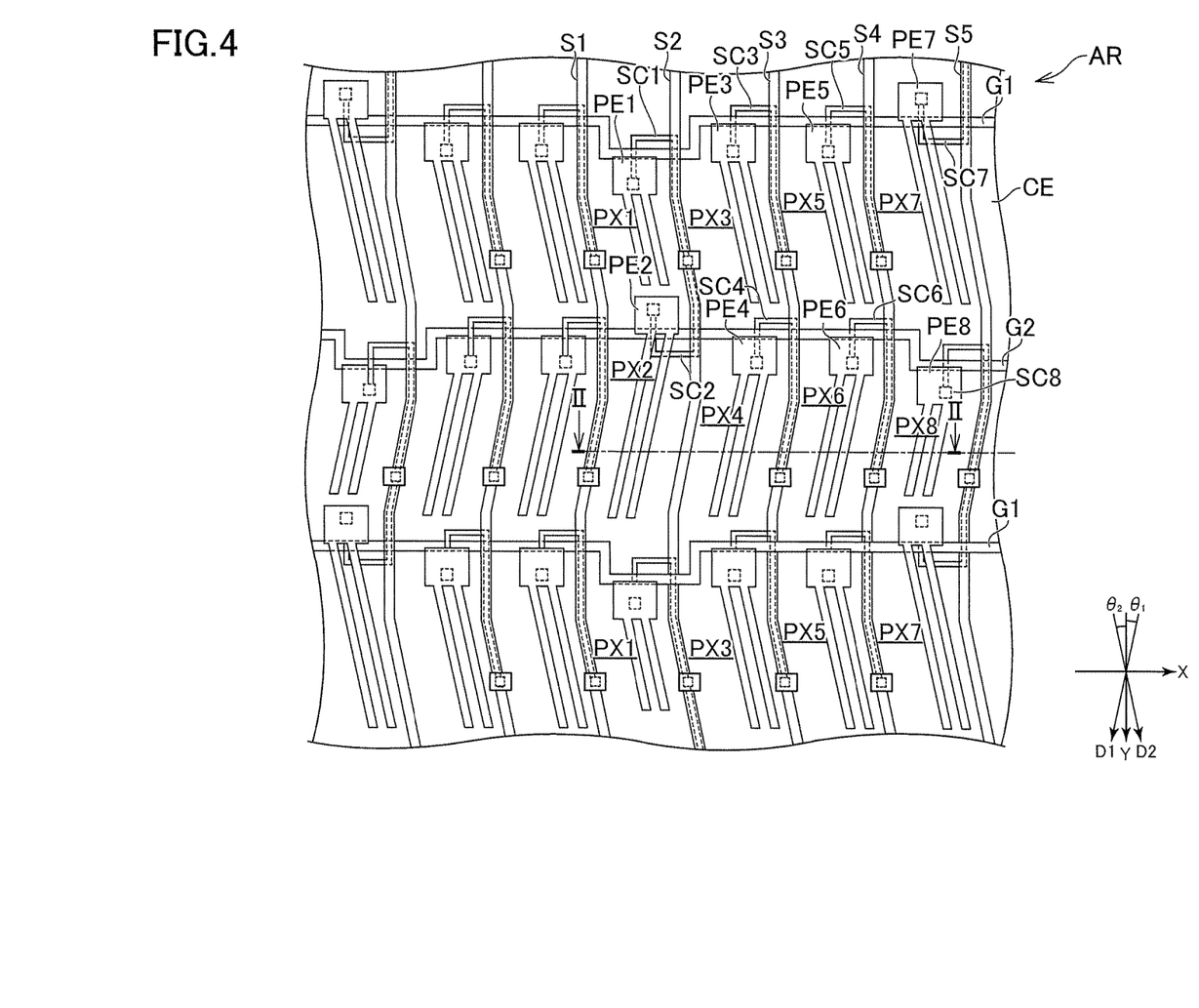
FIG. 4 is a schematic plan view of the structure of pixels on the array substrate viewed from the opposite substrate.

The pixel electrode PE (PE1 to PE8) is an electrode that has a contact electrode PB (PB1 to PB4) and two strip electrodes PA (PA1 to PA4) extending from the contact electrode PB (see FIG. 4 or the like). As illustrated in FIG. 2, the pixel electrode PE is formed on the third insulating film 13 and opposed to the common electrode CE. That is, the strip electrode PA is positioned above the common electrode CE with the third insulating film 13 intervening. The third insulating film 13 corresponds to an interlayer insulating film between the common electrode CE and the pixel electrode PE.

As illustrated in FIG. 2, for example, the pixel electrode PE2 is positioned between the source line S1 and the source line S2; the pixel electrode PE4 is positioned between the source line S2 and the source line S3; and the pixel electrode PE6 is positioned between the source line S3 and the source line S4. The pixel electrode PE is made of transparent conductive material, for example, ITO or IZO. The pixel electrode PE is covered by the first alignment layer AL1, which covers the third insulating film 13 as well. The first alignment layer AL1 is made of material having horizontal alignment property, and disposed on the surface of the array substrate AR that contacts the liquid crystal layer LQ.

Meanwhile, the opposite substrate CT is made using a transparent second insulation substrate 20, such as a glass substrate or a resin substrate. The opposite substrate CT has a light shielding layer (black matrix) BM, a color filter CF, an overcoat layer OC, a second alignment layer AL2, or the like, formed on the side thereof opposed to the array substrate AR of the second insulation substrate 20.

The light-shielding layer BM is formed on the inner surface of the second insulating substrate 20. The light-shielding layer BM is positioned above each source line S. The light-shielding layer BM is made of black resin material or light-shielded metal material.

Each color filter CF is formed on the inner surface of the second insulation substrate 20. As illustrated in FIG. 2, for example, the color filter CF2 is opposed to the pixel electrode PE2; the color filter CF4 is opposed to the pixel electrode PE4; the color filter CF6 is opposed to the pixel electrode PE6; and the color filter CF8 is opposed to the pixel electrode PE8.

In this embodiment, the color filter CF2 is made of resin material dyed blue; the color filter CF4 is made of resin material dyed red; the color filter CF6 is made of resin material dyed green; and the color filter CF8 is made of resin material dyed white (or transparent). The color filter CF8 may not strictly be an achromatic filter but may be a pale-colored (for example, pale yellow or pale blue) filter. The boundary between the color filters C falls on the light-shielding layer BM.

The overcoat layer OC covers the color filter CF. The overcoat layer OC planarizes the asperity on the front surface of the color filter CF. The overcoat layer OC is made of transparent resin material and covered by the second alignment layer AL2. The second alignment layer AL2 is made of material having horizontal alignment property, and disposed on the surface of the opposite substrate CT that contacts the liquid crystal layer LQ.

As described above, the array substrate AR and the opposite substrate CT are disposed such that the first alignment layer AL1 and the second alignment layer AL2 face to each other. In the above, a predetermined cell gap is formed between the array substrate AR and the opposite substrate CT due to a pillar type spacer formed on one of the substrates. That is, the array substrate AR and the opposite substrate CT are attached to each other by a sealing member with the cell gap formed. The liquid crystal layer LQ is formed using liquid crystal material containing liquid crystal molecules LM filled between the first alignment layer AL1 and the second alignment layer AL2 (see FIG. 5). The alignment of the liquid crystal molecules LM is controlled through an electric field formed between the pixel electrode PE and the common electrode CE.

Beside the back surface of the liquid crystal display panel LPN having the above described structure, a backlight BL is disposed. A backlight BL may be implemented in various formats, which is not described here in detail.

On the outside surface 105 of the first insulating substrate 10, a first optical device OD1 including a first polarizer PL1 is disposed. Meanwhile, on the outside surface 20B of the second insulation substrate 20, a second optical device OD2 including a second polarizer PL2 is disposed. The first polarizer PL1 and the second polarizer PL2 are disposed so as to hold a crossed Nicol positional relationship in which the respective polarizing axes orthogonally intersect with each other.

Figure 3:
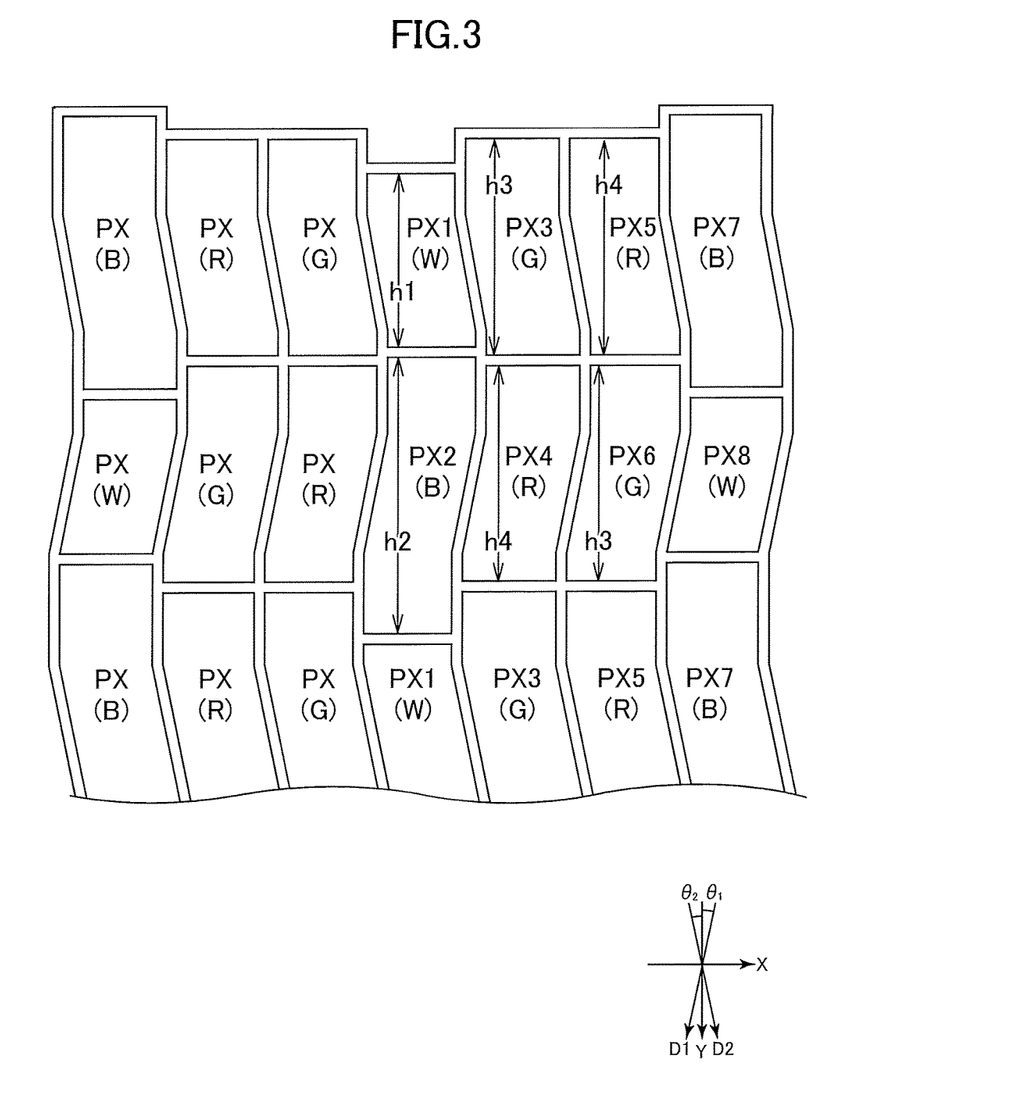
FIG. 3 is a schematic plan view of one example of the layout of pixels in this embodiment.
Figure 5:
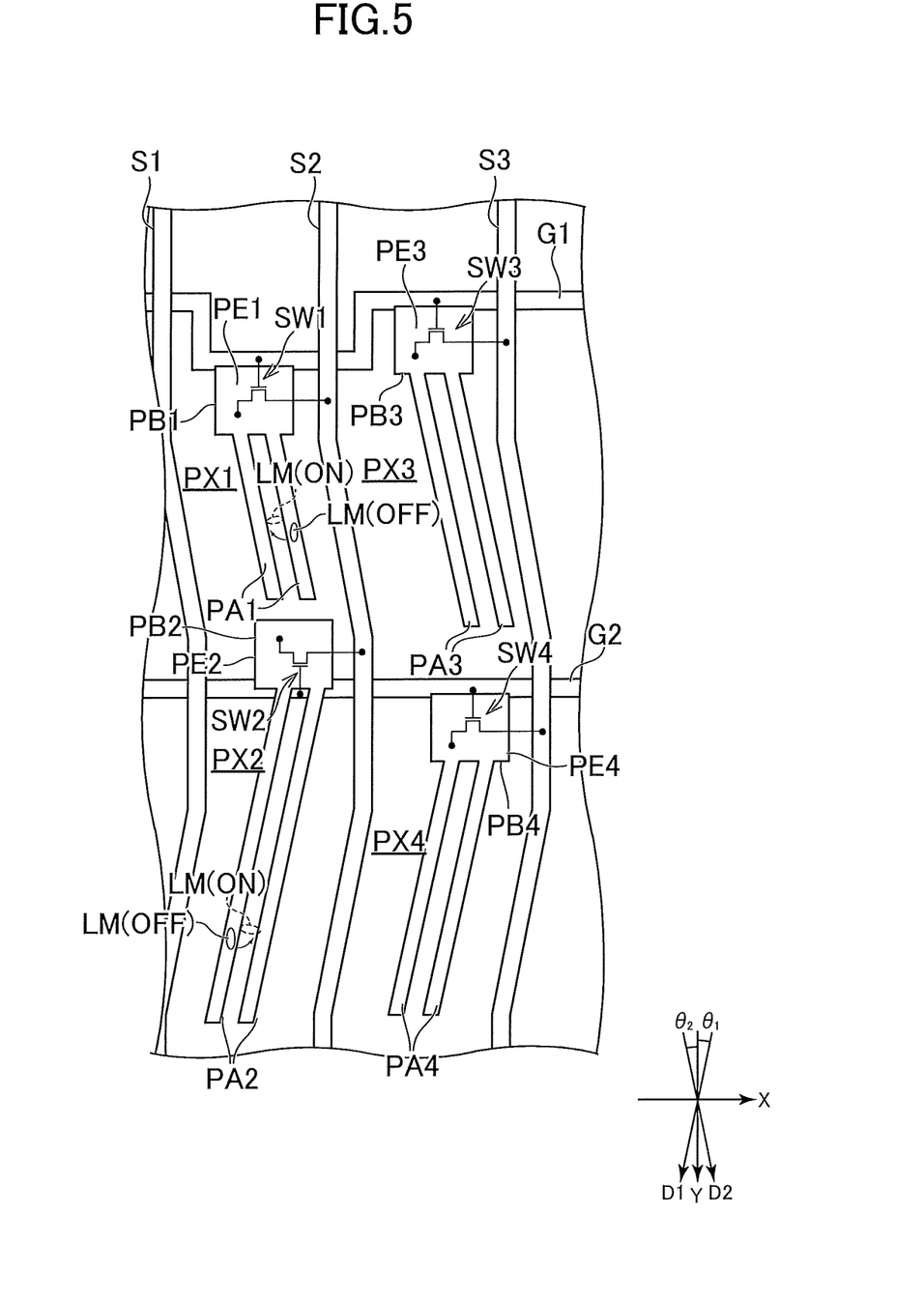
FIG. 5 is a schematic plan view of an example of a structure of a switching device.
Figure 6:
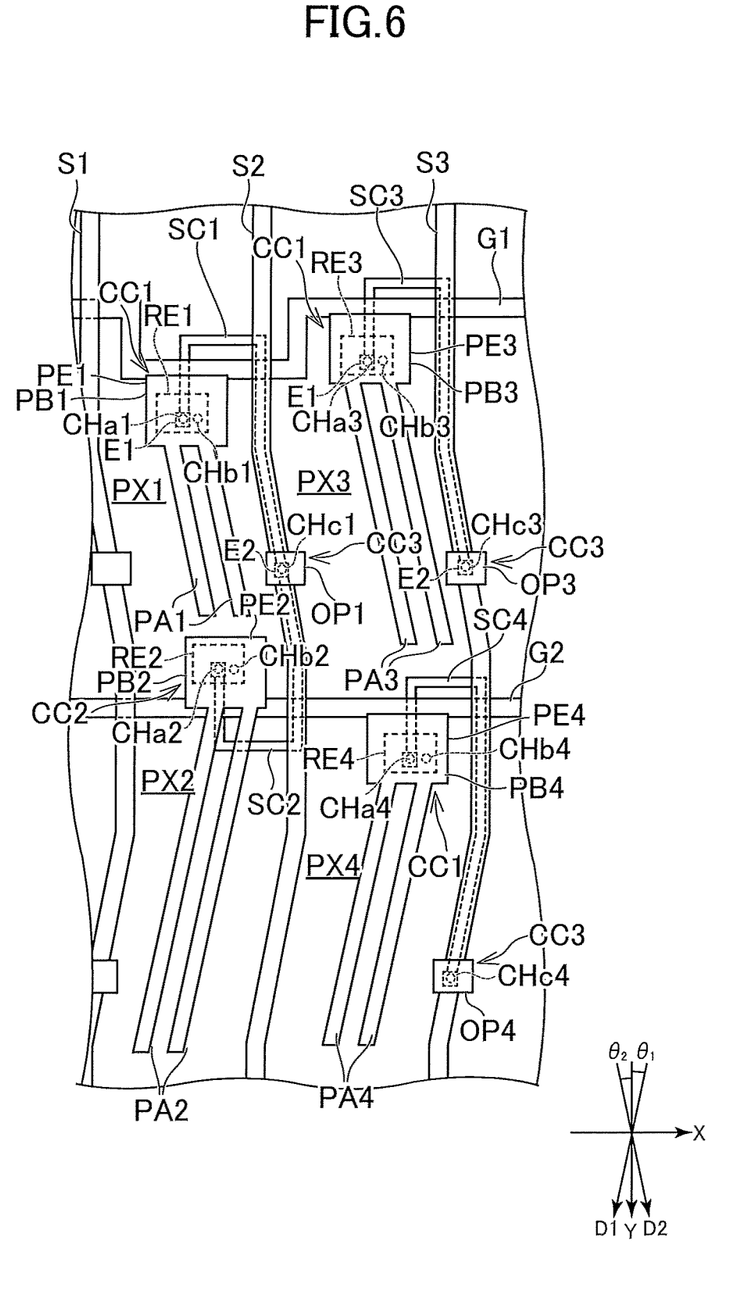
FIG. 6 is an enlarged plan view of a part of the structure illustrated in FIG. 4, which corresponds to the structure illustrated in FIG. 5.

With reference to FIGS. 3 to 6, a pixel structure in this embodiment will be described. FIG. 3 is a schematic plan view of one example of the layout of pixels in this embodiment. FIG. 4 is a schematic plan view of the structure of pixels on the array substrate viewed from the opposite substrate. FIG. 5 is a schematic plan view of an example of the structure of a switching device. FIG. 6 is an enlarged plan view of apart of the structure illustrated in FIG. 4, which corresponds to the structure illustrated in FIG. 5.

As described above, the array substrate AR includes the gate lines G, the source lines S, the switching devices SW, the common electrodes CE, the pixel electrodes PE, the first alignment layer AL1, or the like. The plurality of gate lines G extend substantially along the first direction X. The plurality of source lines S extend substantially along the second direction Y to intersect the gate lines G. The plurality of gate lines G are aligned in the second direction Y at a substantially equal interval, while the plurality of source lines S are aligned in the first direction X at a substantially equal interval.

In the active area ACT, a plurality of pixels PX (referred to also as a pixel area) are arranged in a matrix, each disposed in an area defined by two gate lines G and two source lines S. The plurality of pixels in the active area ACT are assigned respective different colors so that color display can be implemented.

Specifically, as illustrated in FIG. 3, the pixel PX1 is a pixel for white W. A pixel PX2 adjacent to the pixel PX1 for white W in the second direction Y is a pixel for blue B. A pixel PX3 adjacent to the pixel PX1 for white W in the first direction X is a pixel for green G. A pixel PX4 adjacent to the pixel PX2 for blue B in the first direction X is a pixel for red R. A pixel PX5 adjacent to the pixel PX3 for green G in the first direction X is a pixel for red R. A pixel PX6 adjacent to the pixel PX4 for red R in the first direction X is a pixel for green G. A pixel PX7 adjacent to the pixel PX5 for red R in the first direction X is a pixel for blue B. A pixel PX8 adjacent to the pixel PX7 for blue B in the second direction Y is a pixel for white W. The pixels PX1 to PX8 aligned as described above are repetitively and alternately disposed in the second direction Y in the active area ACT, although only some of such pixels are illustrated in FIG. 3.

In this embodiment, pixels PX adjacent to each other in the first direction X are pixels for different colors. Pixels PX adjacent to each other in the second direction Y are pixels for different colors at least in a column including pixels for blue B and white W. Although pixels for different colors are aligned in a column of pixels for red R and green G as well in the example in FIG. 3, pixels for red R and green G may be aligned differently. For example, pixels aligned in one column in the second direction Y may all for red R or all for green G. That is, pixel areas for red R or green G may be successively disposed in a single column of pixel areas.

As illustrated in FIGS. 3 and 4, or the like, in this embodiment, a multi-domain structure utilizing two pixel areas aligned in the Y direction is employed for improved viewing angle. Specifically, the pixel PX2, the pixel PX4, the pixel PX6, and the pixel PX8 disposed between the same gate lines G each extend in a first extending direction D1 rotated clockwise relative to the second direction Y so as to intersect the second direction Y by an acute angel. Meanwhile, the pixel PX1, the pixel PX3, the pixel PX5, and the pixel PX7 disposed between the same gate lines G each extend in a second extending direction D2 rotated counterclockwise relative to the second direction Y so as to intersect the second direction Y by an acute angle. The angle θ1 between the second direction Y and the first extending direction D1 is substantially the same as the angle θ2 between the second direction Y and the second extending direction D2.

In this embodiment, as illustrated in FIG. 3, assume that the respective aperture widths in the second direction Y of a pixel for white W, a pixel for blue B, a pixel for green G, and a pixel for red R are defined as h1, h2, h3, and h4, and that h2>h3=h4>h1 is held. That is, the aperture width of a pixel for blue B is the largest; ones for pixels for green G and red R are the second largest; and one for a pixel for white W is the smallest. In other words, the area of a pixel area for blue B is the largest; ones for green G and red R are the second largest; and one for white W is the smallest. When the aperture width of a pixel for blue B, which has the smallest luminance, is largest, as described above, sufficient luminance necessary for the pixel for blue B can be obtained. Note that luminance is the brightness of a light emitting surface per a unit area when viewed in a certain direction. The luminance of blue B is the smallest among those of blue B, white W, red R, and green R. The aperture width of a pixel PX is determined depending on the disposition of light shielding structural components, such as the gate line G, the source line S, and the switching device SW, or the like, as will be described later in detail.

As illustrated in FIG. 5, each pixel PX includes a switching device SW and a pixel electrode PE. The switching device SW is a thin film transistor (TFT), for example. In the structure illustrated, the switching device SW includes a thin film transistor having a double gate structure.

Specifically, the pixel PX1 includes a switching device SW1 and a pixel electrode PE1. The switching device SW1 is electrically connected to the pixel electrode PE1 and the source line S2. The pixel PX2 includes a switching device SW2 and a pixel electrode PE2. The switching device SW2 is electrically connected to the pixel electrode PE2 and the source line S2. The pixel PX3 includes a switching device SW3 and a pixel electrode PE3. The switching device SW3 is electrically connected to the pixel electrode PE3 and the source line S3. The pixel PX4 includes a switching device SW4 and a pixel electrode PE4. The switching device SW4 is electrically connected to the pixel electrode PE4 and the source line S3.

As illustrated in FIG. 5, the pixel electrode PE includes a contact electrode PB and two strip electrodes PA extending from the contact electrode PB. The contact electrode PB and the strip electrodes PA are integrally or continuously formed. The number of strip electrodes PA of each pixel electrode PE is not limited to two but may be three or more.

Specifically, the pixel electrode PE1 includes a contact electrode PB1 and two strip electrodes PA1 extending from the contact electrode PB1 in the second extending direction D2. Similarly, the pixel electrode PE3 includes a contact electrode PB3 and two strip electrodes PA3 extending from the contact electrode PB3 in the second extending direction D2.

Meanwhile, the pixel electrode PE2 includes a contact electrode PB2 and two strip electrode PA2 extending from the contact electrode PB2 in the first extending direction D1. Similarly, the pixel electrode PE4 includes a contact electrode PB4 and two strip electrodes PA4 extending from the contact electrode PB4 in the first extending direction D1. Note that the end portion of the strip electrode PA opposite from the contact electrode PB may not be an open end, as is illustrated in FIG. 5, and that the end portions of the two strip electrodes PA may be connected to each other.

The switching device SW illustrated in FIG. 5 includes a semiconductor layer SC and a relay electrode RE illustrated in FIG. 6. The semiconductor layer SC has a substantially J-shape, and intersects the gate line G at two positions. The intersecting portion functions as a gate electrode. One end of the semiconductor layer SC is electrically connected to the contact electrode PB of the pixel electrode PE through the contact hole CHa, the contact hole CHb, and the relay electrode RE, while the other end of the same is electrically connected to the source line S through the opening OP of the contact hole CHc.

Specifically, the switching device SW1 includes a semiconductor layer SC1 and a relay electrode RE1. The semiconductor layer SC1 is made of low temperature polysilicon (LTPS) formed into a substantially J-shape, and intersects the gate line G1 at two positions. One end of the semiconductor layer SC1 is connected to the contact electrode PB1 through the contact hole CHa1, the contact hole CHb1, and the relay electrode RE1, and the other end of the same is connected to the source line S2 through the contact hole CHc1.

Note that although a semiconductor layer SC made of LIPS has been described as an example, amorphous silicon (a-Si) or oxide semiconductor, for example, may be used to form the semiconductor layer SC.

The following describes an operation in a liquid crystal display device having the above described structure with reference to FIG. 5. In an off state in which a voltage for causing a potential difference across the pixel electrode PE and the common electrode CE is not applied, no voltage is applied to the liquid crystal layer LQ. That is, no electric field is formed between the pixel electrode PE and the common electrode CE. Thus, the liquid crystal molecules LM contained in the liquid crystal layer LQ are in the initial alignment, that is, being aligned in the second direction Y, on the XY plane, due to an anchoring force of the first alignment layer AL1 and the second alignment layer AL2 (see the solid line in FIG. 5). That is, the initial alignment direction of the liquid crystal molecules LM is parallel to the second direction Y.

Furthermore, in an off state, the light from the backlight BL partially passes through the first polarizer PL1 to enter the liquid crystal display panel LPN. The light having entered the liquid crystal display panel LPN is, for example, a linearly polarized light that is orthogonal to the first absorption axis of the first polarizer PL1. The state of polarization of such a lineally polarized light rarely changes when the light passes through the liquid crystal display panel LPN in an off state. Consequently, most of the linearly polarized light having passed through the liquid crystal display panel LPN is absorbed by the second polarizer PL2 (black display).

Meanwhile, in an on state in which a voltage for causing a potential difference across the pixel electrode PE and the common electrode CE is applied, a voltage is applied to the liquid crystal layer LQ. That is, a fringe electric field is formed between the pixel electrode PE and the common electrode CE. Thus, the liquid crystal molecules LM are aligned in a direction different from the initial alignment direction on the XY plane (see the broken line in FIG. 5).

Specifically, the liquid crystal molecules LM of the pixel PX1 rotate clockwise to be aligned in a direction substantially parallel to the fringe electric field on the XY plane, while the liquid crystal molecules LM of the pixel PX2 rotates counter-clockwise to be aligned in a direction substantially parallel to the fringe electric field on the XY plane. In the above, the liquid crystal molecules LS are aligned in a direction in accordance with the magnitude of the electric field. In an on state, the linearly polarized light orthogonal to the first absorption axis of the first polarizer PL1 enters the liquid crystal display panel LPN. The state of polarization of the light changes, depending on the alignment state of the liquid crystal molecules LM, when the light passes through the liquid crystal layer LQ. Thus, in an on state, the light having passed through the liquid crystal layer LQ at least partially passes through the second polarizer PL2 (white display). With this structure, a normally black mode is achieved.

Figure 7:
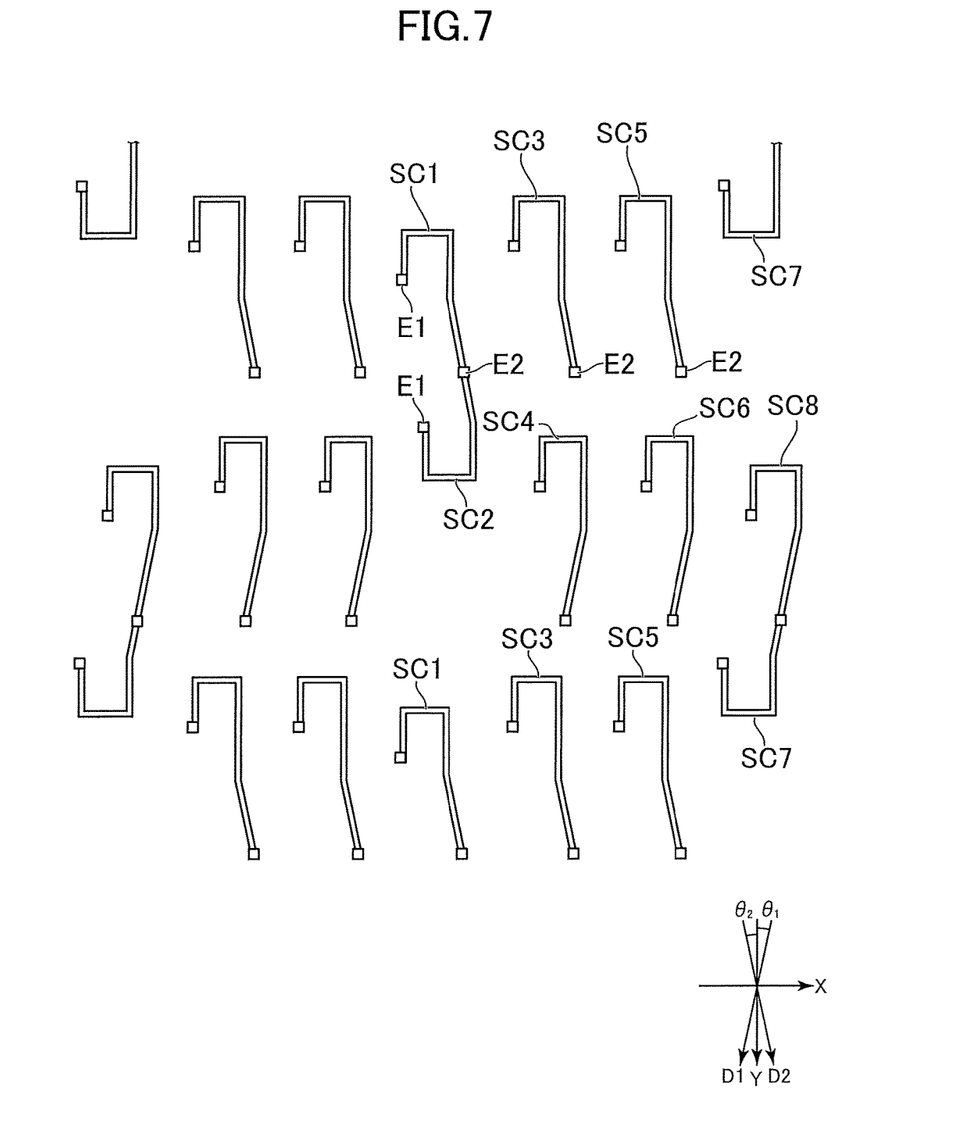
FIG. 7 explains the disposition of a semiconductor layer in this embodiment.

The following specifically describes the disposition of the gate line G, the source line S, and the semiconductor layers SC of the switching device SW according to the present invention. FIG. 7 explains the disposition of a semiconductor layer in this embodiment, with structures other than the semiconductor illustrated in FIG. 4 not illustrated.

With reference to the semiconductor layers SC1 to SC8, disposition of the semiconductor layer SC will be described. Each of the semiconductor layers SC1 to SC8 has a substantially J-shape, and includes a first end portion E1 electrically connected to the relay electrode RE1, and a second end portion E2 electrically connected to the source line S. As illustrated in FIG. 7, the width between the first end portion E1 and the second end portion E2 in the second direction Y is larger than that of any other portions of the semiconductor layer SC. The width between the first end portion E1 and the second end portion E2, however, is not necessarily larger than that of any other portion of the semiconductor layer SC, and any structure that allows for electrical connection between the semiconductor layer SC and the relay electrode RE1 and between the semiconductor layer SC and the source line S is applicable.

As illustrated in FIG. 7, the semiconductor layer SC1, the semiconductor layer SC3, the semiconductor layer SC5, and the semiconductor layer SC7 are aligned in this order in the first direction X at a substantially equal interval. Of these layers, the semiconductor layer SC3 and the semiconductor layer SC5 are disposed at the substantially same position in the second direction Y, while the semiconductor layer SC1 is deposed with displacement in the second direction Y from the semiconductor layer SC3 and the semiconductor layer SC5. Consequently, as illustrated in FIGS. 4 and 6, the gate line G is laid out so as to bend in a position corresponding to the semiconductor layer SC1.

Further, the semiconductor layer SC7 is disposed reversed in the second direction Y relative to the semiconductors SC1, 3, 5. That is, along the second direction Y, the direction in which the portion of the semiconductor SC 7 with the end portion E2 is directed is opposite from the direction in which the corresponding portions of the semiconductor layers SC1, 3, 5 are directed.

The semiconductor layer SC2, the semiconductor layer SC4, the semiconductor layer SC6, and the semiconductor layer SC8 are aligned in this order in the first direction X at a substantially equal interval. Of these layers, the semiconductor layer SC4 and the semiconductor layer SC6 are disposed in the substantially same positions in the second direction Y, while the semiconductor layer SC8 is disposed with displacement in the second direction Y from the semiconductor layers SC4 and SC6. Consequently, as illustrated in FIGS. 4 and 6, the gate line G2 is laid out so as to bend in a position corresponding to the semiconductor layer SC8.

Further, the semiconductor layer SC2 is disposed reversed in the second direction Y relative to the semiconductor layers SC4, 6, 8. That is, along the second direction Y, the direction in which the portion of the semiconductor layer SC2 with the end portion E2 is directed is opposite from the direction in which the corresponding portions of the semiconductor layers SC4, 6, 8 are directed.

Below, a structure in the pixel PX1 that includes the first end portion E1 of the semiconductor layer SC1, the relay electrode RE1, and the contact electrode PB1 and electrically connects the semiconductor layer SC1 and the pixel electrode PE1, as illustrated in FIG. 3, will be hereinafter referred to as a first contact structure CC1. Similarly, a structure in the pixel PX2 that includes the first end portion E1 of the semiconductor layer SC2, the relay electrode RE2, and the contact electrode PB2 and electrically connects the semiconductor layer SC2 and the pixel electrode PE2 will be hereinafter referred to as a second contact structure CC2. A structure that includes the second end portion E2 of the semiconductor layer SC1, the second end portion E2 of the semiconductor layer SC2, and an opening OP1 and electrically connects the semiconductor layer SC1 and the semiconductor layer SC2, respectively, and the source line S2 will be hereinafter referred to as a third contact structure CC3.

In this embodiment, the first contact structure CC1 and the second contact structure CC2 are both disposed within the pixel PX1. With this disposition, assuming that the pixel PX1 is a white pixel and the pixel PX2 is a blue pixel, the second contact structure CC2 is not disposed in the pixel PX2, that is, a blue pixel, as illustrated in FIG. 3.

That is, this structure can increase the aperture ratio of the blue pixel PX2 with small luminance.

As described above, the end portion E2 of the semiconductor layer SC1 that is electrically connected to the source line S2 is disposed so as to be opposed in the second direction Y to the end portion E2 of the semiconductor layer SC2, which is adjacent to the semiconductor layer SC1 in the second direction Y, the end portion E2 electrically connected to the source line S2. Specifically, the semiconductor layer SC1 and the semiconductor layer SC2 are integrally formed into a substantial C-shape. In this embodiment, this disposition enables electrical connection between the respective semiconductor layers SC1 and SC2 and the source line S2, using a common third contact structure CC3. This is similarly applied to the disposition of the semiconductor layer SC8 and the semiconductor layer SC7. This structure eliminates the need for forming a contact hole on the source line S2 in the pixel PX2. As presence of a contact hole leads to reduction in driving area of liquid crystal, reduction of a contact hole leads to improvement in the aperture ratio. Accordingly, in this embodiment, it is possible to increase the aperture ratio of a blue pixel PX2 with small luminance. That is, it is possible to reduce the number of contact structures in this embodiment, as compared with a structure including no common contact structure for a semiconductor layer and a source line.

As described above, it is possible to widen an area that contributes to display of a pixel with small luminance (the blue pixel PX2) in this embodiment. This can prevent shortage in luminance of a pixel with small luminance. Moreover, reduction in the number of contact structures can produce an advantage of unlikely occurrence of light leakage, which can lessen drop in contrast ratio of each pixel. As a result, it is possible achieve higher luminance and low power consumption.

Although a structure in which a blue pixel as a second pixel is disposed adjacent to a white pixel as a first pixel in the second direction Y so that the blue pixel can have a larger aperture width has been described in this embodiment, any structure that allows a pixel with small luminance to have a larger aperture width is usable without limitation on pixel disposition. For example, a blue pixel as a second pixel with small luminance may be disposed adjacent in the second direction to a red or green pixel as a first pixel with larger luminance than that of the blue pixel so that the blue pixel can have a larger aperture width.

Although a structure in which the third contact structure CC3 is shared by adjacent pixels PX in the second direction Y has been described in this embodiment, sharing the third contact structure CC is not an essential structure. For example, the second contact structure CC2 for electrical connection between the respective semiconductor layers SC1 and SC2 and the source line S2 may be separately formed.

Note that the gate line G1 in this embodiment corresponds to the first gate line in the present invention. Similarly, the gate line G2 corresponds to the second gate line; the source line S1 corresponds to the first source line; the source line S2 corresponds to the second source line; the semiconductor layer SC1 corresponds to the first semiconductor layer; the semiconductor layer SC2 corresponds to the second semiconductor layer; the switching device SW1 corresponds to the first switching device; the switching device SW2 corresponds to the second switching device; the pixel PX1 corresponds to the first pixel; the pixel PX2 corresponds to the second pixel; and the pixel PX3 corresponds to the third pixel.

While there have been described what are at present considered to be certain embodiments of the invention, it will be understood that various modifications may be made thereto, and it is intended that the appended claims cover all such modifications as fall within the true spirit and scope of the invention.

What is claimed is:
1. A liquid crystal display device, comprising:
a plurality of gate lines extending in a first direction;

a plurality of source lines extending in a second direction; and a plurality of pixel areas each surrounded by respective of the plurality of the gate lines and respective of the plurality of the source lines, and arranged in a matrix, wherein each of the pixel areas includes a switching device connected through a contact hole to the respective source line, each of the plurality of pixel areas is assigned any of at least four colors, two colors out of the four colors are alternately arranged in a same column of the pixel areas, and the switching devices in the respective pixel areas for the two colors alternately arranged share the contact hole connected to the respective source line.

2. The liquid crystal display device according to claim 1, wherein the four colors include red, green, blue, and white, and the two colors alternately arranged in the same column of the pixel areas are blue and white.

3. The liquid crystal display device according to claim 2, wherein the respective pixel areas for red and green are alternately disposed in the same column of the pixel areas, and the pixel area for red is disposed adjacent to the pixel area for blue in a direction along a row of the pixel areas.

4. The liquid crystal display device according to claim 2, wherein the pixel areas for red are disposed successively in a same column of the pixel areas, and the pixel areas for green are disposed successively in a same column of the pixel areas.

5. The liquid crystal display device according to claim 2, wherein an area of the pixel area for blue is larger than an area of the pixel area for white.

6. The liquid crystal display device according to claim 5, wherein the area of the pixel area for blue is larger than an area of the pixel area for red or green, and the area of the pixel area for white is smaller than the area of the pixel area for red or green.

7. A liquid crystal display device comprising:

a plurality of first gate lines and a plurality of second gate lines extending along a first direction and alternately disposed in a second direction intersecting the first direction;

a first source line and a second source line extending along the second direction, and disposed adjacent to each other in the first direction;

a first pixel disposed in an area defined by the first gate line and the second gate line adjacent to each other and the first source line and the second source line adjacent to each other, and having a first switching device having a first semiconductor layer electrically connected to the first gate line and the second source line;

a second pixel disposed adjacent to the first pixel in the second direction and having a second switching device having a second semiconductor layer electrically connected to the second gate line and the second source line and having luminance smaller than luminance of the first pixel;

a first contact structure disposed on a side of the first pixel via the first gate line and electrically connecting the first semiconductor layer and the first gate line; and a second contact structure disposed on the side of the first pixel via the second gate line and electrically connecting the second semiconductor layer and the second gate line, wherein the first semiconductor layer extends from the first contact structure, bends so as to intersect the first gate line at two positions, and further extends to the side of the first pixel along the second source line, and the second semiconductor layer extends from the second contact structure, bends so as to intersect the second gate line at two positions, and further extends to the side of the first pixel along the second source line.

8. The liquid crystal display according to claim 7, wherein the first semiconductor layer and the second semiconductor layer are electrically connected to the second source line through a common third contact structure.

9. The liquid crystal display according to claim 7, wherein the first pixel is disposed each on each of both sides of the second pixel in the second direction.

10. The liquid crystal display according to claim 7, further comprising:

a third source line disposed adjacent to the second source line in the first direction, and extending in the second direction; and a third pixel having a third switching device having a third semiconductor layer electrically connected to the first gate line and the third source line, and disposed adjacent to the first pixel in the first direction and, wherein the first gate line is laid out so as to bend such that a width of the first pixel in the second direction is smaller than a width of the third pixel in the second direction.

11. The liquid crystal display device according to claim 7, wherein the first pixel is a pixel for white, and the second pixel is a pixel for blue.

* * * * *